United States Patent [19]

Schupp et al.

[11] Patent Number: 4,596,759

[45] Date of Patent: Jun. 24, 1986

[54] DRY FILM RESIST CONTAINING TWO OR MORE PHOTOSENSITIVE STRATA

[75] Inventors: Hans Schupp, Wachenheim; Albert Elzer, Otterstadt, both of Fed. Rep. of Germany

[73] Assignee: BASF Aktiengesellschaft, Fed. Rep. of Germany

[21] Appl. No.: 669,213

[22] Filed: Nov. 7, 1984

[30] Foreign Application Priority Data

Nov. 7, 1983 [DE] Fed. Rep. of Germany ....... 3340154

[51] Int. Cl.[4] .............................................. G03C 1/76
[52] U.S. Cl. .................................. 430/271; 430/273; 430/312; 430/313; 430/326
[58] Field of Search ............. 430/156, 326, 271, 270, 430/312, 313, 502, 573

[56] References Cited

U.S. PATENT DOCUMENTS

| | | | |
|---|---|---|---|
| 3,782,939 | 1/1974 | Bonham et al. | 96/35.1 |
| 3,837,860 | 9/1974 | Roos | 96/91 |
| 3,849,137 | 11/1974 | Barzynsky et al. | 430/294 |
| 4,193,797 | 3/1980 | Cohen et al. | 430/258 |
| 4,217,407 | 8/1980 | Watanabe et al. | 430/156 |
| 4,349,620 | 9/1982 | Cry et al. | 430/259 |
| 4,504,566 | 3/1985 | Dueber | 430/156 |

FOREIGN PATENT DOCUMENTS 0076565 8/1982 European Pat. Off. .
1379117 8/1971 United Kingdom .

*Primary Examiner*—Jack P. Brammer
*Attorney, Agent, or Firm*—Keil & Weinkauf

[57] ABSTRACT

In the production of imagewise structured resist layers, for example for the manufacture of printed circuits, electronic components, soldering masks, etc., by application, onto a substrate, of a positive-working resist layer (R) which can be rendered soluble by exposure to actinic light, imagewise exposure of the resist layer (R) to actinic light and removal of the exposed parts of the layer by washing out with a developer, the photosensitive resist layer (R) used, in particular in the form of a dry film resist, consists of two or more strata (S) which posses different basic solubilities, at least the upper stratum (U) being photosensitive and the lower stratum (LS) having a higher basic solubility in the developer than has the upper stratum (U).

19 Claims, No Drawings

DRY FILM RESIST CONTAINING TWO OR MORE PHOTOSENSITIVE STRATA

The present invention relates to a process for the production of imagewise structured resist layers on a substrate, eg. resist images or soLdering masks, in which a multistratum positive-working photosensitive resist-forming layer applied on the substrate is exposed imagewise to actinic light, and the exposed parts of the layer are then removed by washing out with a developer. The present invention furthermore relates to a dry film resist which can be used in this process and possesses a solid multi-stratum positive-working photosensitive resist-forming layer which is applied on a temporary base and can be transferred to a substrate with the use of pressure and, if necessary, heat.

Positive-working photosensitive recording materials for the production of imagewise structured resist layers, as can be used in, for example, the production of circuit paths, printed circuits, thin-film circuits, electronic components, soldering masks, etc., are described in many publications in the literature. Compared with the negative-working photopolymerizable or photocrosslinkable resist materials and with the positive-working recording materials based on photopolymerizable systems, which can be desensitized by exposure to actinic light and consequently the photopolymerization in the exposed parts suppressed, positive-working photosensitive resist materials, in which, after imagewise exposure, the exposed parts are soluble in solvents in which they were previously insoluble, frequently possess advantageous performance characteristics. For example, the resolving power of such positive-working resist materials which can be rendered soluble by exposure to actinic light is frequently improved, and resist layers produced from these materials can be exposed imagewise and developed a number of times in succession, and after each development step the particular surface of the substrate which has been bared can be modified in the desired manner, which can, if necessary, differ in each case.

Positive-working coating materials and dry film resists which are rendered soluble by exposure to actinic light are described in, inter alia, DE-A-20 28 903, DE-A-22 36 914, U.S. Pat. Nos. 3,782,939, 3,837,860 and 4,193,797. The positive-working resist materials disclosed in these publications are based on compounds which contain o-quinonediazide groups and which react to form alkali-soluble photolysis products on exposure to actinic light. A particular disadvantage of these resist materials based on o-quinonediazide compounds is the relatively short shelf life and the fact that their resistance to aqueous alkaline media is not particularly high; this restricts their processability and use.

DE-C-21 50 691 and DE-A-29 22 746 describe very advantageous positive-working resist materials or dry film resists which are rendered soluble when exposed to actinic light and whose photosensitive layer is based on polymers which contain o-nitrocarbinol ester groups and can be washed out with an aqueous alkaline developer after the exposure procedure. These resist materials have a long shelf life, are simple to process and permit multiple exposure and. development of the resist layer. Advantageous further developments of these resist materials and embodiments of methods for processing them are described in copending U.S. patent application Ser. No. 525,395, filed Aug. 22, 1983 by the same assignee.

The resist materials and dry film resists described in the publications stated above consist of a homogeneous photosensitive resist layer. A disadvantage is that these resist layers require comparatively long exposure times. With a view to rapid, easy processability, it is desirable to keep the exposure times as short as possible but nevertheless to achieve exact reproduction of the image-bearing transparency, faithful to the original and meeting the requirements set with respect to resist layers.

EP-A-76 565 describes a fast positive-working photopolymerizable element for the production of resist layers, in which a curable gelatin layer is coated with a conventional negative-working photopolymerizable layer. After imagewise exposure of the photopolymerizable layer, during which the exposed parts undergo polymerization and crosslinking, a curing agent for the gelatin layer is allowed to diffuse through the photopolymerizable layer, the unexposed parts of the latter layer allowing the curing agent to diffuse more readily than do the exposed photopolymerized parts. As a result, the gelatin layer is cured imagewise. The upper, photopolymeric layer and the non-cured parts of the gelatin layer are then removed using a developer, a positive image being formed as a result. Even though it is possible to achieve short exposure times with these resist materials, this process is very prone to problems owing to the relatively small differentiation between the diffusion properties, permits only relatively poor resolution and moreover is very expensive because of the number of process steps.

U.S. Pat. No. 4,349,620 discloses a dry film resist possessing a multi-stratum photosensitive resist layer which can be negative-working or positive-working. According to U.S. Pat. No. 349,620, the individual photosensitive strata of the resist layer should differ in their properties such that better differentiation is achieved between the adhesion properties of the resist layer with respect to the temporary base of the dry film resist, the temporary cover sheet of this resist, and the final substrate with which the resist layer is laminated. This should make it possible for the temporary cover sheet or the temporary base of the dry film resist to be peeled off more easily from the photosensitive resist layer during its processing than in the case of the conventional materials of this type. The differentiated adhesion properties of the individual strata of the resist layer are established in particular by varying the molecular weight of the polymeric binder present in the photosensitive resist layer, or of the photosensitive polymeric material. Otherwise, the composition of the individual strata of the resist layer is kept substantially the same; in particular, the individual stratum should possess similar exposure properties. This multi-stratum resist material requires the same long exposure times as a corresponding single-stratum resist layer of the same materials.

It is an object of the present invention to provide a positive-working resist material which can be rendered soluble by exposure to actinic light, possesses improved exposure properties and is suitable for the production of imagewise structured resist layers by a conventional method. The resist material should, in particular, permit the use of short exposure times and at the same time possess high resolving power without other important properties, such as stability, mechanical and chemical resistance, etc., of the resist being adversely affected. It should be simple to handle and to process, permit exact image reproduction faithful to the original, even in fine elements, and have a wide range of uses.

We have found that this object is achieved if, in the process for the production of an imagewise structured resist layer by application of a positive-working resist layer, which can be rendered soluble by exposure to actinic light, onto a substrate, imagewise exposure of the photosensitive resist layer and washing out of the exposed parts of the layer, the multi-stratum resist material used, advantageously in the form of a dry film resist, possesses a photosensitive resist layer consisting of two or more strata which are located directly one on top of the other and have different basic solubilities, and at least the stratum which is the upper one relative to the substrate is photosensitive and is rendered soluble or dispersible in the developer by exposure to actinic light, the stratum which is the lower one relative to the substrate possesses a higher basic solubility in the developer, and the exposed parts of the entire resist layer can be washed out in a developer after the imagewise exposure.

The present invention accordingly relates to a process for the production of imagewise structured resist layers, e.g. resist images or soldering masks, on a substrate, by application of a positive-working resist layer (R), which can be rendered soluble by exposure to actinic light, onto the substrate, imagewise exposure of the photosensitive resist layer (R) to actinic light and removal of the exposed parts of the layer by washing out with a developer, the said resist layer (R) consisting of two or more solid strata (S) which are located directly one on top of the other, wherein at least that stratum (U) of the resist layer (R) which is uppermost after application onto the substrate consists of a photosensitive material which, by exposure to actinic light, is rendered soluble or dispersible in a solvent in which it was previously insoluble, and that stratum (LS) of the resist layer (R) which is the lower one after application onto the substrate has a higher basic solubility than the upper stratum (U), in the developer used for washing out the imagewise exposed parts of the resist layer (R).

The present invention furthermore relates to a dry film resist, in particular for use in the production of printed circuits, electronic components for soldering masks, which comprises a dimensionally stable temporary base (T) and, applied on this, a solid positive-working resist layer (R), which is capable of lamination, can be rendered soluble by exposure to actinic light and consists of two or more different strata (S), and preferably possesses a cover sheet (C) on the photosensitive resist layer (R), which can be peeled off from the said resist layer (R) without simultaneous removal of the temporary base (T). In the dry film resist, the strata (S) of the photosensitive resist layer (R) possess different basic solubilities, and at least that stratum (U) of the resist layer (R) which is adjacent to the temporary base (T) consists of a photosensitive material which, by exposure to actinic light, can be rendered soluble or dispersible in a solvent in which it was previously insoluble, and the one or more strata.(LS) of the photosensitive resist layer (R) which are not bonded to the temporary base (T) have a higher basic solubility than the upper stratum (U), in the developer used for washing out the imagewise exposed parts of the resist layer (R).

For the purposes of the present invention, the basic solubility is the tendency, before exposure to actinic light, of the individual strata (S) of the photosensitive resist layer (R), in particular of the polymers which in general form, or substantially form, the strata (S), to dissolve in the developer used for washing out the resist layer (R), or to permit themselves to be dispersed in this developer. If the lower stratum (LS) is intended to have a higher basic solubility than the upper stratum (U) of the photosensitive resist layer (R), this accordingly means that it is possible, even before imagewise exposure to actinic light, for the lower stratum (LS), in contrast to the upper one (U) to be sufficiently soluble or dispersible in the developer to permit development, or that it is possible for the lower stratum (LS), before exposure to actinic light, to be insoluble or indispersible in the developer used for developing the resist layer (R), but to exhibit greater solveophilicity than the upper stratum (U), in this developer. This has the effect that, compared with the upper stratum (U) of the photosensitive resist layer (R), the lower stratum (LS) can be rendered soluble or dispersible in the developer in a shorter time at a given radiation intensity, or by means of a lower radiation intensity for a given irradiation time.

The differentiation between the basic solubilities of the individual strata (S) of the photosensitive resist layer (R) is achieved via their composition, i.e. via the type and amount of the components forming these strata (S), in particular the type or the composition of the polymer or polymers generally present as the essential component in the strata (S). The higher basic solubility of the lower stratum (LS) is most simply achieved if this stratum consists of, or has as its essential component, a polymer which, compared with the polymers present in the upper stratum (U), possesses a greater number of solveophilic groups. Since the conventional positive-working resist layers which can be rendered soluble by exposure generally contain polymers which can be washed out with aqueous alkaline developers after exposure, the higher basic solubility of the lower stratum (LS) can be achieved, in particular, if the polymer of the lower stratum (LS) contains a higher proportion of acidic groups, preferably carboxyl groups, anhydride groups or other groups which increase the hydrophilicity. Preferably, the mean molecular weights of the polymers in the upper stratum (U) and in the lower stratum (LS) are of the same order of magnitude; the mean molecular weight of the polymer constituting the essential component of the lower stratum (LS) is preferably the same as, similar to or greater than the mean molecular weight of the polymer forming the essential component of the upper stratum (U) of the photosensitive resist layer (R).

In the novel multi-stratum positive-working photosensitive resist layers, the resist layer (R) becomes soluble, after exposure for only a short time, down to the lowest part of the layer which is applied on the substrate surface, so that the said layer (R) can be washed out satisfactorily with a developer, over the entire thickness of the layer. Particularly surprising is the fact that the reduction in the exposure time is not achieved at the expense of other important properties of the resist materials, e.g. sensitivity to overwashing, resolution, or mechanical or chemical resistance, for example to the process chemicals used during the production and further processing of the imagewise structured resist layers.

The stratum (U) which is the upper one after application of the novel multi-stratum resist layer (R) onto the temporarily or permanently protected substrate is solid and always photosensitive and, when the said layer (R)

is used in the form of a dry film resist, exhibits moderate adhesion to the temporary base (T), which should be capable of being removed from the upper stratum (U) after application of the photosensitive resist layer (R) onto the substrate and either before or after imagewise exposure of this layer. Suitable recording materials for the upper stratum (U) are in principle any conventional positive-working recording materials which, on exposure to actinic light, are rendered soluble in a solvent in which they were previously insoluble. These include, for example, the positive-working recording materials based on o-quinonediazides containing polymers, as described in the patent literature cited at the outset. The resist materials based on o-quinonediazide compounds are prepared in general by esterifying an o-quinonediazide in the presence of a hydroxyl-containing polymer. The o-quinonediazides possess carboxyl or sulfo groups which are capable of undergoing an esterification reaction with the polymeric hydroxyl component. Examples of suitable polymeric hydroxyl components are polymeric polyols, e.g. polyvinyl alcohol, hydroxyl-substituted homo- and copolymers of (meth)acrylates, natural colloids, such as gelatin, etc. Regarding the preparation and the composition of the polymers which contain o-quinonediazide groups and are suitable for positive-working resist materials, and regarding the composition of such resist materials based on o-quinonediazides, reference may otherwise be made to the relevant literature, which is familiar to the skilled worker.

Particularly advantageously, the upper stratum (U) of the novel photosensitive resist layers (R) consists of a positive-working photosensitive resist material which contains, as the photosensitive component, a compound which possesses two or more aromatic and/or heteroaromatic o-nitrocarbinol ester groups of the general formula (I)

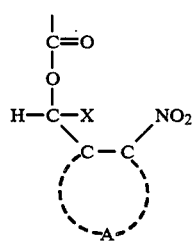
(I)

where A is a radical of an unsubstituted or substituted aromatic or heteroaromatic ring system possessing 5 to 14 ring members, and X is hydrogen, alkyl of 1 to 8 carbon atoms or unsubstituted or substituted aryl or aralkyl. Particularly suitable resist materials are those which contain, as the photosensitive component, a polymer which has a molecular weight higher than 500 and contains not less than 5% by weight, based on the molecular weight of the polymer, of aromatic and/or heteroaromatic o-nitrocarbinol ester groups of the general formula (I). Very advantageous resist materials of this type, and the processing of these materials to imagewise structured resist layers, are described in, for example, DE-C-21 50 691, DE-A-29 22 746, DE-A-32 31 147 and DE-A-33 26 036. In the compounds possessing the aromatic and/or heteroaromatic o-nitrocarbinoL ester groups of the general formula (I), the aromatic or heteroaromatic ring system A which has the o-nitrogroup can be mononuclear or polynuclear. Among the aromatic ring systems, benzene is particularly preferred, and the benzene ring can be monosubstituted or polysubstituted, for example by $C_1$–$C_8$-alkyl, in particular methyl, by $C_1$–$C_6$-alkoxy, in particular methoxy, by halogen, such as chlorine or bromine, or by nitro, amino, monomethylamino, dimethylamino, nitrile or sulfo. Examples of suitable polynuclear aromatic ring systems are naphthalene, anthracene, anthraquinone, phenanthrene and the corresponding substituted derivatives. A preferred heteroaromatic ring system is the pyridine radical. In the general formula (I), X is, in particular, hydrogen, methyl, ethyl or unsubstituted or substituted phenyl. Examples of particularly preferred aromatic or heteroaromatic o-nitrocarbinols from which the o-nitrocarbinol ester groups of the general formula (I) are derived are o-nitrobehzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alcohol, α-(o-nitrophenyl)-o-nitrobenzyl alcohol and 2-nitro-3-hydroxymethylpyridine.

The compounds possessing the aromatic and/or heteroaromatic o-nitrocarbinol ester groups can be low molecular weight esters having two or more ester groups of the general formula (I), in particular the di- and/or polyesters of low molecular weight di- and/or polycarboxylic acids with aromatic and/or heteroaromatic o-nitrocarbinols of the type under discussion. In this case, the photosensitive material for the upper stratum (U) of the novel resist layers (R) also contains a polymeric binder which is compatible with these esters; for example, acrylate and/or methacrylate polymers have proven particularly useful for this purpose. However, high molecular weight compounds possessing functional groups which undergo crosslinking with carboxyl groups, in particular polyepoxides, are also suitable polymeric binders in this case.

Photosensitive resist materials which have proven particularly useful for the upper stratum (U) are those which contain, as the photosensitive component, a polymer which has a molecular weight higher than 500 and contains, bonded in the molecule, not less than 5% by weight, based on the molecular weight of the polymer, of aromatic and/or heteroaromatic o-nitrocarbinol ester groups of the general formula (I). The mean number average molecular weight of these polymers is preferably from 10,000 to 100,000. An advantageous polymer carrying the o-nitrocarbinol ester groups is an organic polycarboxylic acid whose carboxyl groups are esterified with the aromatic and/or heteroaromatic o-nitrocarbinols. The organic polycarboxylic acids are in general homo- or copolymers of ethylenically unsaturated mono- or dicarboxylic acids of 3 to 6 carbon atoms, in particular homo- or copolymers of α,β-unsaturated mono- or dicarboxylic acids such as acrylic acid, methacrylic acid, maleic acid, fumaric acid and/or crotonic acid. In these polycarboxylic acids, some or all of the carboxyl groups can be esterified with the aromatic and/or heteroaromatic o-nitrocarbinols. The photosensitive polymers carrying o-nitrocarbinol ester groups can contain one or more comonomers, in addition to the unsaturated carboxylic acids which are partially or completely esterified With the o-nitrocarbinols. Particularly important comonomers in this context are ethylene, styrene and the $C_1$–$C_8$-alkyl esters of the above ethylenically unsaturated carboxylic acids, in particular the alkyl acrylates and methacrylates. Examples of suitable photosensitive polymers are the (meth)acrylic acid/(meth)acrylate copolymers, some or all of whose carboxyl groups are esterified with the aromatic and/or heteroaromatic o-nitrocarbinols under discussion. In addition to the o-nitrocarbinol ester groups of the general formula (I), the photosensitive polymers can also contain other reactive functional groups, e.g. hydroxyl, amine, amide, N-methylolamide, epoxide and/or blocked isocyanate groups. Examples of comonomers which contain such reactive functional groups and which may be present in the photosensitive polymers containing o-nitrocarbinol ester groups of the general formula (I) are N,N-dimethylaminoethyl (meth)acrylate, N-vinylimidazole, (meth)acrylamide, hydroxyalkyl (meth)acrylates, methylol compounds of the amol type, e.g. N-methylol(meth)acrylamide, glycidyl (meth)acrylate, allyl glycidyl ether, 4-vinylcyclohexene dioxide and the like. The said polymers can be prepared by a conventional process, for example by polymerization of aromatic and/or heteroaromatic o-nitrocarbinol esters of ethylenically unsaturated carboxylic acids of the type under discussion, in particular of acrylic and/or methacrylic acid, alone or, advantageously, together with comonomers of the stated type, in particular (meth)acrylic acid derivatives.

The amount of aromatic and/or heteroaromatic o-nitrocarbinol ester groups in these polymers is in general not less than 5% by weight, based on the molecular weight of the polymer, and can vary within wide limits, depending in particular on the properties which the resist materials are required to possess. On exposure to actinic light, the o-nitrocarbinol ester groups undergo cleavage and free carboxyl groups are formed in the polymer, with the result that the solubility of the latter is altered; hence, the change in the solubility of the photosensitive resist materials based on these polymers during their imagewise exposure to actinic light depends on the o-nitrocarbinol ester groups in the polymer. The content of o-nitrocarbinol ester groups of the general formula (I) in the polymers is therefore generally chosen so that the resist layers or strata produced with these polymers are, after exposure to actinic light, soluble or dispersible in aqueous developers, in particular aqueous alkaline solutions. Preferably, the content of aromatic and/or heteroaromatic o-nitrocarbinol ester groups of the general formula (I) in the photosensitive polymers is from 10 to 30% by weight, based on the molecular weight of the polymer. The said polymers can be employed alone or as a mixture with one another.

In addition to containing the stated photosensitive compounds which, by exposure to actinic light, are rendered soluble in a solvent in which they were previously insoluble, in particular the compounds containing o-nitrocarbinol ester groups of the general formula (I) and in particular the polymers possessing the aromatic and/or heteroaromatic o-nitrocarbinol ester groups, the photosensitive resist materials employed for the upper stratum (U) of the novel resist layers (R) can also contain further additives and/or assistants which improve and/or modify the general properties of these resist materials. These include, for example, sensitizers which improve the photosensitivity and the spectral sensitivity of the resist materials, and dyes, pigments and/or photochromic substances, plasticizers, leveling agents, finely divided fillers, etc. Examples of sensitizers are xanthene dyes, such as fluorescein, eosin and Rhodamine S, and triplet energy carriers, as described, for example, by N.J. Turro in Molecular Photochemistry, W.A. Benjamin Inc., New York, 1967, page 132. Dyes which have proven useful include Sudan dyes, polymethine dyes, azo dyes, phthalocyanine dyes, disperse dyes, eosin, crystal violet and malachite green. Particularly advantageous dyes are those which undergo a reversible or irreversible color change when exposed to actinic light. Examples of plasticizers, which preferably should be compatible with the other components of the resist materials, and in particular with the polymers present therein, are tricresyl phosphate, n-butylbenzyl phthalate and liquid polyesters obtained from aliphatic dicarboxylic acids and bifunctional glycols, in particular polyesters of adipic acid and propylene 1,2-glycol or butane-1,4-diol, having a viscosity of from 1,000 to 15,000 cP. Examples of leveling agents include silicone oils, these agents being used in particular during processing of the resist materials from solution. The addition of fillers has proven particularly advantageous in the production of soldering masks, examples of suitable fillers being talc, calcium carbonate, silicon dioxides, e.g. quartz flour, amorphous silica and pyrogenic silica, silicates, e.g. aluminum silicates and silicate glasses, aluminas, glass powder or glass dust, bentonites, etc. The mean particle size of these fillers is in general from 5 to 100 nm, preferably from 10 to 50 nm.

In a particular embodiment, the photosensitive resist materials based on compounds containing o-nitrocarbinol ester groups of the general formula (I), in particular the polymers containing aromatic and/or heteroaromatic o-nitrocarbinol ester groups, can also contain, as additives, low molecular weight and/or high molecular weight compounds which possess two or more reactive functional groups which, under the action of heat, are capable of reacting with the free carboxyl groups which are liberated during exposure of the compounds containing the o-nitrocarbinol ester groups of the general formula (I), or with the other reactive functional groups which may be present in the photosensitive polymers, in addition to the aromatic and/or heteroaromatic o-nitrocarbinol ester groups. Advantageous additives are those compounds effecting crosslinking and possessing reactive functional groups for which the thermal crosslinking reaction with the compounds containing o-nitrocarbinol ester groups of the general formula (I) takes place at above 50° C., in particular above 80° C. Examples of such additives are those low molecular weight and/or high molecular weight compounds which contain two or more hydroxyl, amine, N-methylolamide, amide, epoxide and/or, preferably, blocked isocyanate groups in the molecule.

Examples of such additives which effect crosslinking and possess reactive functional groups are the di- and polyepoxides, which include the reaction products of epichlorohydrin with polyols, the reaction products of epichlorohydrin with polyamines, polyolefin epoxides, epoxidized polybutadiene, epoxy resins of the novolak type, high polymers of glycidyl esters of unsaturated carboxylic acids, in particular of (meth)acrylic acid and others; di- and polyisocyanates, in particular blocked di- and polyisocyanates, particularly suitable protective components for effecting blocking being phenols, acetone oxime, methyl ethyl ketoxime, acetoacetates and malonates; and hydroxyl-, amino- and/or N-methylol-containing polymers, e.g. phenol/formaldehyde resins, urea/formaldehyde resins and melamine/formaldehyde resins, the resins of the novolak type being preferred. The low molecular weight crosslinking additives of the stated type can also act as plasticizers, so that their presence makes it possible to dispense with the addition of some or all of the other plasticizers.

The photosensitive resist materials which contain, as additives, compounds effecting crosslinking and possessing reactive functional groups, or which contain photosensitive polymers possessing further reactive functional groups, can also contain, as additives for such subsequent crosslinking reactions and post-curing reactions, catalysts which can be activated photochemically and/or thermally. These can be, for example, diazonium salts, the onium salts of the elements of main groups V, VI and VII of the periodic table, sulfoxonium salts, pyrrilium salts, etc.

The additives and/or assistants are used in conventional amounts in the photosensitive resist materials. The abovementioned crosslinking additives possessing reactive functional groups serve in particular to increase the mechanical and/or chemical stability of the resist layers after the imagewise exposure, and the amount of these additives in the resist materials is therefore chosen in general in accordance with the degrees of crosslinking and curing desired for the imagewise structured resist layers.

The photosensitive resist materials for the upper stratum (U) of the novel resist layers (R) can be prepared by mixing the individual components, for example in a suitable solvent, such as acetone, ethyl acetate, toluene or methylene chloride, to give a homogeneous solution, and casting the latter to produce a layer of the desired thickness.

That stratum (LS) of the novel photosensitive resist layer (R) which is the lower one after application onto the substrate to be modified or permanently protected is likewise solid, and its composition is chosen so that it exhibits good adhesion to the substrate and to the upper stratum (U) on the resist layer (R), to which stratum it is bonded. If the said resist layer (R) is used as a dry film resist, the lower stratum (LS) should exhibit only slight adhesion to the cover sheet (C) of the dry film resist, this adhesion being, in particular, less than that between the upper stratum (U) of the resist layer (R) and the temporary base (T) of the dry film resist. This makes it possible to peel off the cover sheet (C) from the lower stratum (LS) without difficulty before the photosensitive resist layer (R) is applied onto the substrate. Where the novel photosensitive resist layer (R) is employed as a dry film resist, it is, moreover, necessary to select the composition of the lower stratum (LS) of the said layer (R) so that it can be applied, in particular laminated, onto the substrate with the production of sufficient, good adhesion, by a method conventionally used for dry film resists, using pressure and, where necessary, heat.

Depending on the purpose for which the novel photosensitive resist layers (R) are used, the lower stratum (LS) can, even before exposure to actinic light, have a basic solubility which is sufficiently high to permit the said stratum to be washed out with the developer. In this case, the lower stratum (LS) need not be photosensitive, but may be so; regarding the imagewise structuring of the resist layer, it is sufficient if the upper stratum (U) is photosensitive. This applies in particular to uses in which the resolution does not play a decisive role in the imagewise structuring of the resist layer (R), for example in the production of permanent protective and insulating layers, in particular soldering masks. For other intended uses, in particular for the production of etch resists or plating resists, printed circuits, thin-film circuits, etc., it is reasonable if the lower stratum (LS) of the said resist layer (R) is not soluble from the outset in the developer used but, like the upper stratum (U) becomes capable of being washed out with this developer only as a result of exposure to actinic light. In this case, the lower stratum (LS), too, is made from a positive-working photosensitive resist material which, on exposure to actinic light, becomes soluble in a solvent in which it was previously insoluble.

In the case where the lower stratum (LS) of the novel resist layer (R) also comprises a photosensitive resist material, this material can in principle be any positive-working resist material as described above for the upper stratum (U), provided that it has a higher basic solubility than the resist material of the upper stratum (U). Preferably, the lower stratum (LS) consists of a photosensitive resist material which, with the exception of the basic solubility, is substantially similar to that of the upper stratum (U). In this case, too, the lower stratum (LS) preferably consists of a photosensitive resist material based on compounds containing o-nitrocarbinol ester groups of the general formula (I), in particular based on polymers which have a molecular weight higher than 500 and contain not less than 5% by weight of aromatic and/or heteroaromatic o-nitrocarbinol ester groups of the general formula (I). Regarding the compounds containing o-nitrocarbinol ester groups, and in particular the polymers containing these groups, and the additives and/or assistants for these photosensitive resist materials, the statements made above apply as appropriate.

The positive-working photosensitive resist materials under discussion generally form free acidic groups, in particular free carboxyl groups, during exposure to actinic light; hence, when they are used for the production of the lower stratum (LS) of the novel photosensitive resist layer (R), the higher basic solubility relative to the upper stratum (U) can in general be established in a simple manner if the photosensitive resist materials for the lower stratum (LS) contain a higher proportion of hydrophilic groups, in particular acidic groups or anhydride groups, especially free carboxyl groups. In the preferred photosensitive resist materials based on compounds containing o-nitrocarbinol ester groups of the general formula (I), this can most simply be achieved if polymers containing hydrophilic groups, in particular acidic groups such as carboxyl groups, are used in the said resist materials. In the resist materials based on low molecular weight photosensitive compounds containing o-nitrocarbinol ester groups of the general formula (I), these hydrophilic groups are incorporated in the polymeric binder present. In the case of the particularly preferred resist materials based on polymers containing o-nitrocarbinol ester groups of the general formula (I), it is advantageous to use photosensitive copolymers which contain the said groups of the general formula (I) and furthermore contain, as copolymerized units, a higher proportion of unsaturated carboxylic acids, in particular (meth)acrylic acid.

In the photosensitive resist materials for the lower stratum (LS) of the novel resist layers (R), the proportion of hydrophilic groups, in particular free acidic groups, which are preferably incorporated in the polymers of the resist materials, is chosen so that the said resist material, before exposure, cannot be washed out with the developer used for developing the exposed resist layers (R) but, compared with the resist material of the upper stratum (U), requires a lower radiation intensity during the same exposure time to render it capable of being washed out. In particular, the basic solubility of photosensitive resist materials used for the lower stratum (LS) is adjusted so that, for the same exposure time and in comparison with the upper stratum (U), as little as about 5–30%, in particular about 10%, of the radiation intensity is sufficient to render the lower stratum (LS) soluble in the developer.

Where the lower stratum (LS) of the novel photosensitive resist layers (R) is soluble or dispersible in the developer from the outset, i.e. without exposure to actinic light, this lower stratum (LS) can consist of any polymeric materials which are soluble or dispersible in the developer and may contain the additives and/or assistants of the type stated above. These include, for example, polymers which are of the type present in the upper stratum (U) of the said layer (R) but which possess an appropriately high solubility in the developer. Examples of these are the polymers which contain o-nitrocarbinol ester groups of the general formula (I) and which contain a sufficiently high proportion of free carboxyl groups. Since particularly suitable developers are aqueous alkaline media, it is possible in these cases for the lower stratum (LS) of the said resist layers (R) to consist of polymers as are conventionally used for negative-working resist layers which can be developed in aqueous media, such polymers being described in the literature and being soluble or dispersible in aqueous alkaline media. These include, in addition to styrene/-maleic anhydride copolymers and copolymers of styrene with maleic acid half esters, in particular the copolymers based on $\alpha,\beta$-olefinically unsaturated monocarboxylic acids, preferably acrylic acid and/or methacrylic acid. Copolymers which have proven particularly advantageous are those which, in addition to (meth)acrylic acid, contain (meth)acrylates, in particular those of alkanols of 1 to 20, preferably 1 to 8, carbon atoms, e.g. methyl (meth)acrylate, ethyl (meth)acrylate, propyl (meth)acrylate, butyl (meth)acrylate or hexyl (meth)acrylate, as further copolymerized monomers. In addition to the alkyl(meth)acrylates or in place of these, the (meth)acrylic acid copolymers can also contain other comonomers, in particular those possessing reactive functional groups, for example hydroxyl, amine, amide, N-methylolamide, epoxide or similar groups. Examples of such comonomers possessing functional side groups are hydroxyalkyl (meth)acrylates, (meth)acrylamide, N-methylol(meth)acrylamide and glycidyl (meth)acrylate.

Where the lower stratum (LS) of the novel photosensitive resist layers (R) is soluble or dispersible in the developer from the outset, i.e. without exposure to actinic light, the polymers of which the lower stratum (LS) essentially consists preferably have a mean molecular weight which is similar to or higher than the molecular weight of the polymers present in the upper stratum (U). In particular, the number average molecular weight of the polymers which constitute such a lower stratum (LS) is from 10,000 to 100,000. In order to improve and/or to modify the general properties of the lower stratum (LS), the polymers which constitute the lower stratum (LS) in this case can likewise contain additives and/or assistants of the above type. These include, in particular, plasticizers, leveling agents, dyes, pigments, fillers, etc., as well as compounds which effect crosslinking and possess two or more reactive functional groups which are capable of undergoing a thermal crosslinking reaction with the acidic groups, in particular carboxyl groups, and/or with any further functional groups present in the polymers, at elevated temperatures, in particular at above 50° C., preferably above 80° C. Particularly suitable additives of this type which effect crosslinking are the abovementioned di- and polyepoxides, blocked di- and polyisocyanates, di- and polyhydroxides, di- and polyamines, di- and poly-N-methylol compounds and the like. The lower stratum (LS) may furthermore contain, in particular, catalysts which can be activated thermally and which enable this thermal crosslinking reaction to take place, in particular at from 80° to 150° C. Examples of suitable catalysts are dicyanodiamide, melamine/formaldehyde resins and complexes of amines which undergo cleavage only at relatively high temperatures, e.g. the complex of boron trifluoride and ethylamine, and furthermore cationic systems which can be activated thermally, e.g. the conventional iodonium, phosphonium and sulfonium salts.

The novel photosensitive resist layers (R) can be produced by the techniques conventionally used for multistratum resist material. For example, it is possible first to produce the upper stratum (U) and the lower stratum (LS) separately, for example by casting solutions of the components constituting these strata to give layers of the desired thickness, evaporating off the solvent and drying the individual strata, and then to bond the individual strata to one another using pressure and, if necessary, heat.

It is also possible first to produce only the upper or lower stratum of the novel resist layers, for example by casting from solution, and then to apply the other stratum onto this, likewise by casting from solution. The total thickness of the novel multi-stratum photosensitive resist layer (R) can be varied within wide limits, depending on the intended use, and is in general about 0.1 $\mu$m, preferably from about 0.5 $\mu$m to a few mm, preferably not more than about 1 mm. For the production of etch or plating resist layers, for example for the manufacture of printed circuit boards, printed circuits, thin-film circuits, etc., the photosensitive resist layer (R) is in general from 0.1 to 100 $\mu$m thick. In general, thicker resist layers are employed for the production of permanent protective or insulating layers, in particular soldering masks; the total thickness of such layers can be as much as about 1 or 2 mm. The ratio of the thickness of the upper stratum (U) to that of the lower stratum (LS) is in general from 1:10 to 10:1, preferably from 1:5 to 2:1.

Preferably, the novel multi-stratum photosensitive resist layers (R) are employed in the form of dry film resists. To this end, the free surface of the upper stratum (U) of the said layer (R) is applied onto a temporary base (T), and the opposite surface, i.e. the free surface of the lower stratum (LS), is preferably provided with a cover sheet or protective layer (C). A dry film resist of this type, possessing a novel multi-stratum photosensitive resist layer (R) can be produced by conventional prior art techniques. For example, the upper stratum (U) of the said layer (R) can first be applied onto the temporary base (T), for example from solution, and the lower stratum (LS) of the said layer (R) can be produced in a separate step, for example by casting an appropriate solution onto the cover sheet (C). The free surfaces of the upper and lower strata of the laminate elements produced in this manner are then bonded to one another using pressure and, if necessary, heat. However, it is possible, for example, first to apply the upper stratum (U) of the said layer (R) onto the temporary base (T) by a conventional application technique, then to apply the lower stratum (LS) of the said layer (R) onto this upper stratum (U), suitable application techniques likewise being the conventional ones, e.g. casting from solution, pressing on or lamination, and, if required, then to provide the resulting dry film resist with a cover sheet (C) on the free surface of the lower stratum (LS).

Suitable bases (T) for the production of the dry film resists are the dimensionally stable base materials conventionally used for this purpose, in particular plastic films, e.g. polyethylene terephthalate or polybutylene terephthalate films. The cover sheet (C), which can readily be removed from the photosensitive resist layer (R), consists in general of a polyolefin, e.g. polyethylene or polypropylene, or of another suitable polymer film, as conventionally used for such cover sheets.

To carry out the novel process for the production of the imagewise structured resist layers, the novel multi-stratum photosensitive resist layer (R) is first applied onto the substrate which it is intended to modify imagewise or to protect permanently by means of an imagewise structured resist layer. The type of substrate depends, as is known, on the particular use to which the imagewise structured resist layers being produced are to be put. For example, copper sheets or copper-plated bases are used as substrates for the production of etch resists or plating resists. For the production of thin-film circuits, the substrates processed are, in particular, ceramic substrates coated with metallic or metal oxide layers, or semiconductor elements. Substrates frequently used in semiconductor technology are silicon, GaAs or InSb disks whose surface may be provided with an oxide layer or an insulating layer of a general type. For the production of permanent imagewise structured protective or insulating layers, in particular soldering masks, the photosensitive resist layer is applied onto, for example, the circuit diagram of a printed circuit or a printed circuit board provided with holes. The photosensitive resist layer (R) can be applied onto the substrate by applying the idividual strata (S) of the said layer (R) successively onto the substrate; advantageously, however, the pre-prepared multi-stratum photosensitive resist layer (R) is employed, in particular in the form of a dry film resist, and the free surface of the lower stratum (LS) is bonded to the substrate surface in a conventional manner by the action of pressure and, if necessary, heat, any cover sheet (C) present being peeled off beforehand where the dry film resist is employed.

After the photosensitive resist layer (R) has been applied onto the substrate, the desired imagewise structuring is produced by exposing the said layer (R) imagewise to actinic light, preferably light having a wavelength of from 220 to 600 nm, in particular from 300 to 420 nm.

Imagewise exposure of the resist layer (R) can be carried out through an image-bearing transparency, using a suitable light source which emits actinic light in the stated wavelength range. Examples of suitable light sources are carbon arc lamps, high pressure mercury lamps, high pressure xenon lamps, superactinic fluorescent tubes and, in particular, low pressure mercury fluorescence lamps. Imagewise exposure can also be effected by means of an imagewise modulated laser beam, e.g. a UV laser. The duration for the imagewise exposure depends on the composition of the photosensitive resist layer (R), the thickness of the upper stratum (U) of this layer (R), and the radiation intensity. The exposure time is chosen so that the exposed parts of the upper stratum (U) of the said layer (R) are rendered sufficiently soluble or dispersible in the developer and hence can be washed out without difficulty. The time for this exposure can readily be determined in a conventional manner by means of simple preliminary experiments. The composition of the lower stratum (LS) of the said layer (R) is chosen so that, after the stated exposure time and when the upper stratum (U) is of the thickness given, the lower stratum (LS) is also soluble or dispersible in the developer used for washing out the resist layer.

After imagewise exposure of the resist layer (R), the exposed parts of the layer are washed out with a suitable developer in a conventional manner, for example by spraying, rubbing out or brushing out. Suitable developers are in general aqueous media, in particular aqueous alkaline media, which contain alkaline substances, e.g. borax, disodium hydrogen phosphate, sodium carbonate or alkali metal hydroxides, or organic bases, e.g. di- or triethanolamine in order to bring the pH to the most advantageous value. The developers may furthermore contain conventional buffer substances or added surfactants, e.g. sodium carboxymethylcellulose, polyvinyl alcohol, polysodium acrylate and the like. It is also possible to add water-soluble organic solvents, e.g. aliphatic alcohols, acetone or tetrahydrofuran, to the aqueous developers, in particular the aqueous alkaline developers. Suitable developers for the particular photosensitive resist materials employed are familiar to the skilled worker or can be found in the relevant literature.

After the washing out procedure, the resulting imagewise structured resist layer is generally dried to remove residual developer. The procedures involving imagewise exposure and washing out of the photosensitive resist layer (R) can, if necessary, be repeated several times, and, after each washout step and any drying step, the bared parts of the substrate can be modified, for example by platinum plating, etching or doping. Depending on the photosensitive resist materials employed, the resulting imagewise structured resist layers can then (in the case of repeated imagewise exposure and development, after the final exposure and development step) be crosslinked and cured by heating, preferably at above 50° C., in particular from 80° to 150° C., and/or by uniform exposure to actinic light. This version of the process can be used in particular in the case of the photosensitive resist materials based on compounds containing o-nitrocarbinol ester groups of the general formula (I), in particular the corresponding polymers, which either contain further reactive functional groups as copolymerized units in the polymers carrying the o-nitrocarbinol ester groups of the general formula (I) or contain the compounds which effect crosslinking as additives which, under the action of heat, are capable of undergoing crosslinking reactions with the free carboxyl groups produced on exposure or with the other functional groups incorporated in the polymers of the photosensitive materials. As described in DE-A-32 31 147, DE-A-33 26 036 and DE-A-33 31 691, simply heating to sufficiently high temperatures may be sufficient to achieve curing and crosslinking, depending on the photosensitive resist materials used; however, it may also be necessary first to carry out uniform exposure to actinic light prior to heating, in order to produce free carboxyl groups, and consequently a sufficient number of groups which effect crosslinking. It is also possible that curing and crosslinking are effected only by subsequent uniform exposure of the imagewise structured resist layer (R) to actinic light, this being the case when the cross-linking reaction between the free carboxyl groups thus produced and the other crosslinking compounds present in the photosensitive resist materials takes place at an adequate rate even at room temperature.

The imagewise structured resist layers produced by the process described, using the novel multi-stratum photosensitive resist layers (R), can be used for all purposes for which such imagewise structured resist layers are conventionally employed, for example as etch resists and plating resists in the production of printed circuit paths, printed circuits, semiconductor elements, electronic components, thin-film circuits, multi-layer circuits, etc. In these cases, that surface area of the substrate which has been bared by exposing the resist layer through an image-bearing transparency and washing out the layer is then permanently modified, for example by metal deposition or etching, after which the imagewise structured resist layer is removed by stripping with a suitable developer. The imagewise structured resist layers produced according to the invention are also useful as permanent protective or insulating layers, in particular soldering masks. In this case, the imagewise structured resist layer remains on the substrate.

A particular advantage of the novel multi-stratum photosensitive resist layers (R) is that they not only require substantially shorter exposure times compared with single-stratum resist layers having the same total thickness, but in particular also permit easy production of imagewise structured resist layers on, for example, substrates provided with holes, e.g. drilled baseplates for printed circuit boards or the circuit diagrams for printed circuits, as used in the production of soldering masks. When the photosensitive resist Layer (R) is laminated with such substrates provided with holes, the resist material is generally pressed into the holes. In this procedure, baring the holes by imagewise exposure and development is always especially critical since particularly long exposure times are required in the case of the conventional resist materials in order that all the resist parts present in the holes are rendered capable of being completely washed out. This also results in overexposure of the other parts of the layer. This problem is solved in a simple manner when the novel multi-stratum resist layers (R) are used. Even where substrates provided with holes are employed, as are used in particular in the production of printed circuit boards or soldering masks, the novel photosensitive resist layers (R) permit short exposure times to be maintained, and even the resist parts which have been forced into the holes can be washed out completely and readily with the developer. Because they are highly versatile, the novel resist layers and the process according to the invention are moreover particularly advantageous. By suitable choice of the materials for the upper stratum (U) and the lower stratum (LS) and the procedure, the imagewise structured resist layers can be adapted in a simple manner to the requirements of the particular intended use.

The Examples which follow illustrate the invention. Parts and percentages are by weight, unless stated otherwise.

EXAMPLE 1

(a) A solution having the following composition was prepared: 70 parts of a copolymer of 35% of o-nitro-α-methylbenzyl acrylate, 1.3% of acrylic acid and 63.7% of methyl methacrylate, 29 parts of a polyester of adipic acid and butanediol (viscosity 7000 cP at 20° C.), 0.8 part of dibromosuccinic acid, 0.15 part of the polymethine dye of the formula (II)

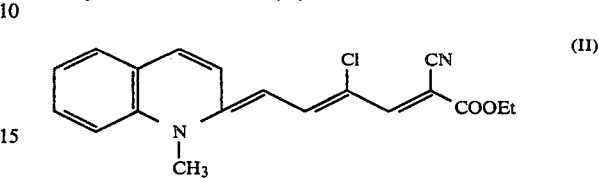

0.05 part of Sudan Deep Black B and 200 parts of ethyl acetate. The solution was filtered through a 1.5 μm filter and was then applied uniformly onto a 23 μm thick heat-set polyethylene terephthalate film with the aid of a knife coater, so that a 12.5 μm thick layer resulted after drying. This layer constituted the upper stratum of the total resist layer.

(b) A solution having the following composition was prepared: 70 parts of a copolymer of 35% of o-nitro-α-methylbenzyl acrylate, 1.6% of acrylic acid and 63.4% of methyl methacrylate, 29 parts of a polyester of adipic acid and butanediol (viscosity 7000 cP at 20° C.), 0.8 part of dibromosuccinic acid, 0.15 part of the polymethine dye of formula (II) above, 0.05 part of Sudan Deep Black B and 200 parts of ethyl acetate. A 12.5 μm thick photosensitive film was produced from this solution as described under (a).

(c) At 120° C. and a rate of 1 m/min, the layer produced as described in (b) was laminated with a copper-plated substrate as used for the production of printed circuit boards, after which the polyethylene terephthalate film was peeled off and the layer produced as described in (a) was then laminated with the stated layer. The resulting multi-stratum resist layer was exposed imagewise through a photographic positive for 1 minute in a 5000 W flat-plate exposure unit. The exposed parts of the layer were washed out for 10 minutes with a mixture of 85% of water, 12% of 2-butoxyethanol and 3% of triethanolamine. The resist image obtained, which was faithful to the original and had crisp edges, was freed from residual developer by blowing out with compressed air. Image elements having a resolution of 30 μm were reproduced faithfully to the original by the resulting imagewise structured resist layer, and the latter exhibited excellent resistance to commercial etching and plating baths.

COMPARATIVE EXPERIMENT A

A single-stratum resist layer was produced in the form of a 25 μm thick film from the same solution as described in Example 1(a). This film was used to produce a resist image by a procedure similar to that described in Example 1(c), In order to obtain properties identical to those of the imagewise structured resist layer of Example 1, an exposure time of 1.75 minutes was required.

EXAMPLE 2

Solutions having the following compositions were prepared:

(a) Upper stratum (U)

70 parts of a copolymer of 45% of o-nitro-α-methylbenzyl acrylate, 1.3% of acrylic acid and 53.7% of methyl methacrylate 29 parts of the polyester from Example 1

0.8 part of dibromosuccinic acid, 0.15 part of the polymethine dye from Example 1

0.05 part of Sudan Deep Black and 200 parts of ethyl acetate.

(b) Lower stratum (LS)

70 parts of a copolymer of 25% of o-nitro-α-methylbenzyl acrylate, 1.6% of acrylic acid 73.4% of methyl-methacrylate 29 parts of the polyester from Example 1, 0.8 part of dibromosuccinic acid 0.15 of the polymethine dye from Example 1

0.05 part of Sudan Deep Black and 200 parts of ethyl acetate.

(c) Both strata were cast to give 12.5 μm thick films as described in Example 1, and the upper stratum (U) was laminated with the lower stratum (LS). The procedure described in Example 1 was followed, except that the exposure time was 45 seconds. The properties of the developed resist were identical to those of the resist from Example 1.

EXAMPLE 3

(Use as soldering mask)

(a) Upper stratum (U)

A solution having the following composition was prepared:

55 parts of a copolymer of 30% of o-nitro-α-methylbenzyl acrylate,

10% of hydroxypropyl acrylate, 0.5% of acrylic acid and 59.5% of methyl methacrylate, 12 parts of IPDI adduct B 1370 (from Veba)

50 parts of the liquid polyester from Example 1, 1 part of dibromosuccinic acid, 0.02 part of the polymethine dye from Example 1, 5 parts of Aerosil 200 (from Degussa), 0.01 part of Sudan Deep Black BB and 200 parts of ethyl acetate.

(b) Lower stratum (LS)

50 parts of a copolymer of 10% of o-nitro-α-methylbenzyl acrylate,

30% of hydroxypropyl acrylate, 1.3% of acrylic acid and 58.7% of methyl methacrylate, 30 parts of IPDI adduct B 1370 (from Veba), 20 parts of the liquid polyester from Example 1, 1 part of dibromosuccinic acid, 0.02 part of the polymethine dye from Example 1, 3 parts of Aerosil 200 (from Degussa), 0.01 part of Sudan Deep Black BB and 200 parts of ethyl acetate.

Both solutions were cast on a polyethylene terephthalate film to give 25 μm thick layers.

(c) The lower stratum (LS) was laminated with a printed circuit, the temporary base was peeled off and the upper stratum (U) was laminated on top of the lower stratum, lamination being carried out at 120° C. and 0.5 m/minute. Imagewise exposure was carried out for 2 minutes through a photographic positive in a 5000 W flat-plate exposure unit. The exposed, decolorized parts of the layer were washed out for 20 minutes with a mixture of 85% of water, 12% of butoxyethanol and 3% of triethanolamine. The resulting resist image, which was faithful to the original and possessed crisp edges, was freed from residual developer by blowing out with compressed air, and was then cured for 2 hours in a through-circulation oven at 150° C. The resist obtained had very high thermal resistance and excellent adhesion to the printed circuit serving as the base, and even fine image elements on this resist were faithful to the original and possessed crisp contours. The holes were not found to contain any residues of resist which had not been washed out. The resulting layer was very suitable for use as a soldering mask.

COMPARATIVE EXPERIMENT B

A solution having the following composition was prepared:

50 parts of a copolymer of 20% of o-nitro-α-methylbenzyl acrylate,

10% of hydroxypropyl acrylate, 0.7% of acrylic acid and 69.3% of methyl methacrylate, 12 parts of IPDI adduct B 1370, 60 parts of the liquid polyester from Example 1, 1 part of dibromosuccinic acid, 0.02 part of the polymethine dye from Example 1, 0.01 part of Sudan Deep Black BB, 4 parts of Aerosil 200 and 200 parts of ethyl acetate.

From this solution, a 50 μm thick layer was cast onto a polyethylene terephthalate film. The layer was laminated with a printed circuit, exposed through a photographic positive for 4 minutes, and washed out and cured, the last two steps being carried out as described in Example 3. The holes still contained residual resist material which, on soldering, gave unsatisfactory connections to electrical components.

EXAMPLE 4

(Use of a completely soluble lower stratum (LS))

(a) Upper stratum (U)

55 parts of a copolymer of 35% of o-nitro-α-methylbenzyl acrylate,

10% of hydroxypropyl acrylate, 0.5% of acrylic acid and 54.5% of methyl methacrylate, 12 parts of IPDI adduct B 1370, 40 parts of the polyester from Example 1, 1 part of dibromosuccinic acid, 0.02 part of the polymethine dye from Example 1, 0.01 part of Sudan Deep Black BB, 4 parts of Aerosil 200 and 200 parts of ethyl acetate.

(b) Lower stratum (LS)

55 parts of a copolymer of 30% of o-nitro-α-methylbenzyl acrylate,

2% of acrylic acid and

68% of methyl methacrylate, 30 parts of IPDI adduct B 1370, 40 parts of the polyester from Example 1, 1 part of dibromosuccinic acid, 0.02 part of the polymethine dye from Example 1, 0.01 part of Sudan Deep Black BB, 3 parts of Aerosil 200 and 200 parts of ethyl acetate.

The individual strata were laminated one on top of the other, on a printed circuit, the thicknesses of the strata being as follows:

| Experiment | Stratum LS | Stratum U | Exposure time |
| --- | --- | --- | --- |
| 4.1 | 25 μm | 25 μm | 1.5 min. |
| 4.2 | 50 μm | 25 μm | 1.5 min. |
| 4.3 | 75 μm | 25 μm | 1.5 min. |
| 4.4 | 35 μm | 15 μm | 1 min. |
| 4.5 | 60 μm | 15 μm | 1 min. |
| 4.6 | 85 μm | 15 μm | 1 min. |

As is evident from the table, the exposure times depend only on the thickness of the upper stratum. Washing out and curing were then carried out as described in Example 3. In every case, the resulting layers were very suitable as soldering masks and had no residual resist material in the holes.

EXAMPLE 5

The solutions (a) and (b) from Example 2 were concentrated so that 50% strength solutions in ethyl acetate were obtained. Solution (a) was then cast on a heat-set polyethylene terephthalate film with the aid of a knife coater, so that the thickness of the dry layer was 12.5 μm. The layer was then dried. Solution (b) was then cast onto the stated layer and was dried, a total thickness of 25 μm resulting. The layer was processed as described in Example 1, except that the exposure time was 45 seconds. The image obtained had a resolution of 30 μm and was very resistant to commercial etching and plating baths.

EXAMPLE 6

The solutions from Example 5 were processed in a single operation with the aid of a dual coater. The resist obtained was of the same quality as that of Example 5.

EXAMPLE 7

(Individual strata of different thicknesses)

Resists having the following thicknesses were produced from the solutions of Example 2:

| Experiment | Stratum U | Stratum LS | Exposure time |
| --- | --- | --- | --- |
| 7.1 | 12.5 μm | 12.5 μm | 45 seconds |
| 7.2 | 10 μm | 15 μm | 40 seconds |
| 7.3 | 5 μm | 20 μm | 30 seconds |

Experiments 7.1 and 7.2 gave resists having a resolution of 30 μm, while Experiment 7.3 gave a resist having a resolution of 50 μm. All of the 3 resists obtained were resistant to etching and plating baths.

We claim:

1. A dry film resist, in particular for use for the production of imagewise structured etch resists or plating resists or imagewise structured permanent protective and insulating layers, comprising a dimensionally stable temporary base (T) and, applied on this, a solid positive-working resist layer (R) which can be rendered soluble by exposure to actinic light and which consists of two or more strata (S) which have different basic solubilities, wherein the stratum (U) adjacent to the temporary base (T) consists of a photosensitive material which, by exposure to actinic light, is rendered soluble or dispersible in a solvent in which it was previously insoluble, and that stratum (LS) of the photosensitive resist layer (R) which is not bonded to the temporary base (T) has a higher basic solubility in the developer used for washing out the exposed resist layer (R) than has the stratum (U), and can be laminated with a substrate to be permanently modified or protected, lamination being effected with the use of pressure and, if necessary, heat, to produce good adhesion to the substrate different basic solubility are photosensitive containing, as photosensitive component, a compound which possesses two or more aromatic and/or heteroaromatic o-nitrocarbinol ester groups of the general formula

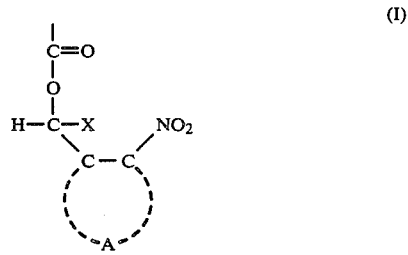

where A is a radical of an unsubstituted or substituted aromatic or heteroaromatic ring system possessing 5 to 14 ring members, and X is hydrogen, alkyl of 1 to 8 carbon atoms or unsubstituted or substituted aryl or aralkyl.

2. A dry film resist according to claim 1, wherein the stratum (LS) of the photosensitive resist layer (R) also consists of a positive-working photosensitive material which, after exposure to actinic light, is soluble in the same developer which dissolves the stratum (U).

3. A dry film resist according to claim 1, wherein the strata (U) and (LS) of the photosensitive resist layer (R) have substantially the same composition.

4. A dry film resist according to claim 1, wherein the ratio of the thickness of the stratum (U) to that of the stratum (LS) is from 1:10 to 10:1.

5. A dry film resist according to claim 1, wherein the ratio of the thickness of the stratum (U) to that of the stratum (LS) is from 1:5 to 2:1.

6. A dry film resist according to claim 1, wherein a cover sheet (C) is also applied on the photosensitive resist layer (R), which cover sheet can be peeled off from the said layer (R) without simultaneous removal of the temporary base (T).

7. A dry film resist according to claim 1 wherein the photosensitive component comprises a polymer which has a molecular weight higher than 500 and contains less than 5% by weight, based on the molecular weight of the polymer, of aromatic and/or heteroaromatic o-nitrocarbinol ester groups of the general formula (I).

8. A dry film resist according to claim 7 wherein said aromatic or heteroaromatic ring system A comprises mononuclear or polynuclear ring system.

9. A dry film resist according to claim 8 wherein said aromatic ring system comprises benzene which may be monosubstituted or polysubstituted by $C_1$-$C_8$-alkyl, in particular methyl, by $C_1$-$C_6$-alkoxy, in particular methoxy, by halogen, such as chlorine or bromine, or by nitro, amino, monomethylamino, dimethylamino, nitrile or sulfo.

10. A dry film resist according to claim 8 wherein said polynuclear aromatic ring systems comprise naphthalene, anthracene, anthraquinone, phenanthrene and the corresponding substituted derivatives.

11. A dry film resist according to claim 10 wherein said heteroaromatic ring system comprises the pyridine radical.

12. A dry film resist according to claim 1 wherein said aromatic or heteroaromatic o-nitrocarbinol ester groups of the general formula (I) are derived from o-nitrobenzyl alcohol, 2-nitro-6-chlorobenzyl alcohol, 2-nitro-4-cyanobenzyl alcohol, 2-nitro-4,5-dimethoxybenzyl alcohol, α-methyl-o-nitrobenzyl alcohol, α-phenyl-o-nitrobenzyl alochol, α-(o-nitrophenyl)-o-nitrobenzyl alcohol and 2-nitro-3-hydroxymethylpyridine.

13. A dry film resist according to claim 1 wherein compounds possessing the aromatic and/or heteroaromatic o-nitrocarbinol ester groups are low molecular weight esters having two or more ester groups of the general formula (I).

14. A dry film resist according to claim 13 wherein said low molecular weight esters comprise the di- and/or polyesters of low molecular weight di- and/or polycarboxylic acids with said aromatic and/or heteroaromatic o-nitrocarbinols.

15. A dry film resist according to claim 14 wherein the photosensitive material for the upper stratum (U) of resist layers (R) also contains a polymeric binder which is compatible with said esters.

16. A dry film resist according to claim 15 wherein said polymeric binder comprises acrylate and/or methacrylate polymers.

17. A dry film resist according to claim 15 wherein said polymeric binder comprises high molecular weight compounds possessing functional groups which undergo crosslinking with carboxyl groups.

18. A dry film resist according to claim 17 wherein said high molecular weight compounds comprises polyeporides.

19. A dry film resist according to claim 7 wherein said polymer has a mean number average molecular weight of 10,000 to 100,000.

* * * * *